(12) United States Patent
Kübelbeck et al.

(10) Patent No.: US 6,695,903 B1
(45) Date of Patent: Feb. 24, 2004

(54) DOPANT PASTES FOR THE PRODUCTION OF P, P+, AND N, N+ REGIONS IN SEMICONDUCTORS

(75) Inventors: Armin Kübelbeck, Bensheim (DE); Claudia Zielinski, Darmstadt (DE); Lilia Heider, Riedstadt (DE); Werner Stockum, Reinheim (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 09/936,285

(22) PCT Filed: Feb. 29, 2000

(86) PCT No.: PCT/EP00/01694

§ 371 (c)(1), (2), (4) Date: Sep. 12, 2001

(87) PCT Pub. No.: WO00/54341

PCT Pub. Date: Sep. 14, 2000

(30) Foreign Application Priority Data

Mar. 11, 1999  (DE) .......................................... 199 10 816

(51) Int. Cl.$^7$ ............................................ H01L 31/048
(52) U.S. Cl. ........................... 106/287.14; 106/287.16; 106/287.17; 106/287.29; 252/950; 438/542; 438/543; 438/923; 438/558; 438/561; 438/559; 438/540
(58) Field of Search .......................... 252/950; 438/562, 438/563, 923, 558, 561, 559, 560; 106/287.14, 287.16, 287.17, 287.29

(56) References Cited

U.S. PATENT DOCUMENTS

| | | | | |
|---|---|---|---|---|
| 2,794,846 A | * | 6/1957 | Fuller | .......................... 136/256 |
| 4,104,091 A | * | 8/1978 | Evans, Jr. et al. | ............. 438/57 |
| 4,152,824 A | | 5/1979 | Gonsiorawski | ............... 29/572 |
| 4,243,427 A | * | 1/1981 | DiBugnara | .............. 106/287.16 |
| 4,277,525 A | * | 7/1981 | Nakayama et al. | .......... 427/387 |
| 4,571,366 A | * | 2/1986 | Thomas et al. | .............. 428/446 |
| 4,588,455 A | * | 5/1986 | Genser | ........................ 438/567 |
| 5,057,336 A | | 10/1991 | Adachi et al. | ................. 427/44 |
| 5,358,597 A | | 10/1994 | Smith et al. | .................. 156/625 |
| 5,458,912 A | | 10/1995 | Camilletti et al. | ........ 427/126.4 |
| 5,472,488 A | * | 12/1995 | Allman | ................... 106/287.16 |
| 6,214,104 B1 | * | 4/2001 | Iida et al. | ............... 106/287.13 |

FOREIGN PATENT DOCUMENTS

| | | |
|---|---|---|
| DE | 19508712 A | 9/1996 |
| EP | 0834489 A | 4/1998 |
| WO | 9324960 A | 12/1993 |
| WO | 9619012 A | 6/1996 |

OTHER PUBLICATIONS

Japanese Abstracts of Japan Abstract for JP 61–279,665.*

Patnet Abstracts of Japan vol. 14, No. 241; May 22, 1990& jp02 066916 A.

Patent Abstracts of Japan vol. 011, No. 141; May 8, 1997& JP 61 279665.

* cited by examiner

*Primary Examiner*—C. Melissa Koslow
(74) *Attorney, Agent, or Firm*—Millen, White, Zelano, Branigan, P.C.

(57) ABSTRACT

The invention relates to novel boron, phosphorus or boron-aluminium dopant pastes for the production of p, p+ and n, n+ regions in monocrystalline and polycrystalline Si wafers, and of corresponding pastes for use as masking pastes in semiconductor fabrication, power electronics or in photo-voltaic applications.

22 Claims, No Drawings

DOPANT PASTES FOR THE PRODUCTION OF P, P+, AND N, N+ REGIONS IN SEMICONDUCTORS

The invention relates to novel boron, phosphorus or boron-aluminium dopant pastes for the production of p, p+ and n, n+ regions in monocrystalline and polycrystalline Si wafers, and of corresponding pastes for use as masking pastes in semiconductor fabrication, power electronics or in photovoltaic applications.

Boron or phosphorus doping of monocrystalline Si wafers in photovoltaic technology and in the case of power semiconductors (e.g. diodes, thyristors) is carried out via the vapour phase (e.g. $POCl_3$, phosphine, $BBr_3$) or with solids (films or solid slices) or with liquid media such as, e.g. phosphoric acid, and other organic B or P systems.

Directly patterned application is not possible with these techniques. Defined regions cannot be selectively doped without using elaborate, e.g. photolithographic processes, to mask the areas that are not to be doped.

Directly patterned application is not possible with these techniques. Defined regions cannot be selectively doped without using elaborate e.g. photolithographic processes to mask the areas that are not to be doped.

In photovoltaic technology, an extensive or local back surface field (BSF) can be achieved by p++ doping on the back. Existing production lines currently operate only with an extensive back surface field, which is obtained by an Al metal layer. Local BSFs have currently only been realized on a laboratory scale, for reasons which will be explained in more detail below.

An extensive back surface field is especially advantageous, inter alia, in the case of thin Si wafers ($\leq 250$ $\mu$m), since otherwise the efficiency of the cell turns out to be significantly lower. Such a BSF is currently obtained in the case of Si wafers of >300 $\mu$m thickness by extensive printing with an aluminium paste. This case is advantageous in that, on the one hand, p+ doping, i.e. a BSF, is built up by the aluminium and, on the other hand, the electricity generated in the cell is also dissipated by the aluminium. In the case of thin wafers, however, curvature of the wafer occurs after the aluminium paste has been burned in. The further handling and processing of such wafers therefore requires special measures since there are pronounced difficulties involved with the incorporation of such bent cells into the usually planar-designed PV modules.

In DE 195 08712 C2 and in K. A. Münzer, R. R. King, R. E. Schlosser, H. J. Schmidt, J. Schmalzbauer, S. Sterk, H. L. Mayer, 13$^{th}$ European Photovoltaic Solar Energy Conference, 23–27 10.1995, p. 1398, attempts are made to solve this problem by a spin-on process with boron. In this case, p++ doping is produced by boron and an aluminium framework is implemented in a subsequent print by means of aluminium paste.

Disadvantages of this process are
a) the large material requirement of the spin-on process
b) the considerable equipment outlay, with which angular wafers are to be coated uniformly using the spin-on process
c) the high throughput and the expensive handling, which are to be realized in mass production only with great difficulty, and
d) that selective patterning of the wafers is not possible, as described above.

The object of the present invention was therefore to provide improved, inexpensive dopant pastes usable in semiconductor technology, which do not have the disadvantages described above and can be used in a straightforward way. The object of the present invention was also to provide corresponding screen-printable pastes.

The object is achieved by dopant pastes for the selective patterning and for the extensive printing of Si wafers for the production of p, p+, p++, n, n+, n++ regions in the Si wafer, containing a) one or more components with dopant action,
b) an $SiO_2$ matrix,
c) solvents,
d) a thickening agent or wetting agent,
e) optionally an acid and water, and optionally
f) additives, the total composition having impurities in the form of metal ions in respective concentrations of less than 200 ppb, preferably less than 100 ppb.

Through tests, it was found that the disadvantages mentioned above are eliminated by the screen-printable dopant pastes found here.

The pastes according to the invention may contain a dopant source selected from the group boron salt, boron oxide, organic boron compounds, boron-aluminium compounds and phosphorus salt, phosphorus oxide, phosphorus pentoxide, phosphoric acid, organophosphorus compounds and organic aluminium compounds.

In principle, the compounds known to the person skilled in the art primarily from main groups III and V of the periodic table are suitable.

The corresponding pastes furthermore contain an $SiO_2$, matrix consisting of one or more $SiO_2$ precursors.

The dopant pastes which have been found may contain one or more dopant sources selected from the group boron oxide ($B_2O_3$), phosphoric acid ($H_3PO_4$), phosphorus pentoxide ($P_2O_5$) and aluminium salt, it being possible for the doping sources to be used in different concentrations.

The present invention also relates to dopant pastes which contain one or more dopant sources from the group of organic boron, phosphorus and aluminium compounds, it being possible for the doping sources to be used in different concentrations.

The object is furthermore achieved by dopant pastes, containing one or more dopant sources selected from the group boron oxide ($B_2O_3$), phosphoric acid ($H_3PO_4$), phosphorus pentoxide ($P_2O_5$) and aluminium salt, and optionally one or more dopant sources from the group of organic boron, phosphorus and aluminium compounds, it being possible for the doping sources to be used in different concentrations.

The $SiO_2$ matrix, which the dopant paste contains, may according to the invention be formed by an organic silicon compound of the general formula $R'_nSi(OR)_{4-n}$, in which R' denotes methyl, ethyl or phenyl,
R denotes methyl, ethyl, n-propyl or i-propyl, and
n denotes 0, 1 or 2.

The present invention furthermore relates to a dopant paste that contains an $SiO_2$ matrix, which is formed by silanes, selected from the group tetramethoxysilane, tetraethoxysilane, tetrabutoxysilane, and tetrapropoxysilane, individually or as a mixture.

The present invention also relates to the use of the described new dopant pastes in semiconductor technology, photovoltaic technology or in power electronics.

Besides the dopant pastes, the invention also relates to masking pastes, containing
a) an $SiO_2$ matrix,
b) solvents, c) a thickening agent or wetting agent, d) optionally an acid and water, and optionally e) additives, the total composition having impurities in the form of metal ions in respective concentrations of less than 200 ppb, preferably less than 100 ppb.

The masking pastes, like the dopant pastes mentioned above composed in the same way, except that the masking pastes are free from dopants, are used according to the invention in semiconductor technology, photovoltaic technology and in power electronics.

It is likewise possible to achieve extensive or selective (selective emitter) phosphorus doping inexpensively and with high throughput by means of screen-printable pastes.

Patterning stages, which are currently made possible by photolithographic processes, can be replaced inexpensively by the use of screen-printable dopant paste.

The masking paste, which can be described as pure $SiO_2$ matrix paste without dopant additives, can be employed for intentionally defined protective layer formation. For this purpose, the paste my be applied extensively to the Si wafer, or else in patterned fashion. This makes it possible to protect defined regions from doping during the diffusion process.

The object is achieved by novel pastes for the selective production of silicate layers doped with phosphorus, boron and boron-aluminium. These pastes are suitable for use in technical printing processes in the electronics industry. These include, especially, screen-printing technology or pad printing.

Depending on the desired field of application, both the concentrations of the individual components and the viscosities may be varied in the pastes that are used.

The dopant pastes according to the invention are furthermore distinguished by a defined matrix. This is formed by an $SiO_2$-forming component during heating in the diffusion process. Together with the component delivering boron or phosphorus, what is described in the literature and known to the person skilled in the art as boro- or phosphorus silicate glass $(B_2O_3)_x*(SiO_2)_y$ or $(P_2O_5)_x*(SiO_2)_y$ is formed. This glass forms the actual source of the dopant during the doping.

The quantity of the $SiO_2$-forming component in the dopant paste is in a modifiable range of 0.1–5% by weight. In relation to the dopant components $B_2O_3$ or $P_2O_5$, the ratio of $SiO_2$ to $B_2O_3$ or $P_2O_5$ may be set arbitrarily, although the range of 10–80% dopant in $SiO_2$ is advantageous. The dopant concentration to be achieved in the silicon can be controlled well through this ratio. The penetration depth of the dopant is, as known in the literature, controlled through the parameters of diffusion time and diffusion temperature.

The doping process is carried out by controlled diffusion in air or oxygen atmosphere. The temperatures for the phosphorus diffusion are, e.g. 900–950° C., and for the boron diffusion about 950–1050° C. The diffusion time may, depending on the application purpose, be from a few minutes to as much as 60 hours or more. Following the diffusion, the wafers are treated with HF (concentration about 2–50% HF), in order to dissolve the phosphorous or borosilicate (PSG, BSG) glass formed. After this treatment, the Si wafer has a free Si surface.

The dopant component is in the concentration range of 0–10% in relation to the dopant paste. In the case of a dopant-free (0% by weight) composition, the masking paste is produced. This is done under the same process conditions as in the case of the dopant pastes.

The solvent forms the main constituent of the paste. The proportion may be in the range of 50–80% by weight of the total quantity.

The proportion of the thickening agents, which are needed for controlled adjustment of the viscosity range and fundamentally for the printability of the dopant, i.e. to form a printable paste, is in the range of about 1–20% by weight in relation to the total quantity of the paste.

Other additives with properties advantageous for the desired purpose are antifoaming agents, adhesion moderators, levelling agents or thixotropic agents. These can positively affect the printability of the paste.

Alkoxysilanes are generally suitable for forming the silicon matrix, in particular silanes of the general formula $R'_nSi(OR)_{4-n}$, in which R' denotes methyl, ethyl or phenyl, R denotes methyl, ethyl, n-propyl or i-propyl, and n denotes 0, 1 or 2.

Examples of suitable silanes are tetramethoxysilane, tetraethoxysilane, tetrabutoxysilane, tetrapropoxysilane, as well as higher and mixed examples, i.e. silanes with longer alkyl chains or silanes with various alkyl residues.

Mixtures of various alkyl- or alkoxysilanes may also be used advantageously.

It may be necessary to prehydrolyse these compounds. The use of such siloxanes as need no pretreatment, such as e.g. polysiloxanes, is advantageous for the production of the pastes according to the invention.

When the substrate is heated in the diffusion furnace, the organic silicon compounds form silicon dioxide, e.g. according to the following equation:

$$C_8H_{20}O_4Si \rightarrow CO_2 + H_2O + SiO_2$$

(TEOS, tetraethyl orthosilicate)

In order to produce the dopant matrix, compounds of boron and phosphorus, as well as aluminium compounds, may be used as the inorganic components. Examples include boron oxide $B_2O_3$, boric acid $B(OH)_3$, phosphoric acid $H_3PO_4$, $P_2O_5$ and Al salts.

Organic compounds of boron and phosphorus as well as organic aluminium compounds can be used as the organic components.

Additives may furthermore be mixed with the pastes according to the invention. These may be both organic and inorganic acids, such as e.g. nitric acid, hydrochloric acid, lactic acid, oxalic acid, formic acid or the like. In particular, these acids are added when hydrolysis of the organic Si compound needs to be carried out. Generally, such organic acids whose alkyl residues have a chain length of n=1–10 are usable. It is possible to use organic acids that have a residue R=OH or =alkyl with n=1–10. The alkyl residues of the salts that can be used may be both straight-chained and branched.

Corresponding additives in the pastes according to the invention are necessary when the organic silicon compound needs to be prehydrolysed. However, in the case of siloxane for example, this additive may be omitted.

Suitable thickening agents include Thixoton (ricinus oil), Borchigen TS (Theological additive for silicic acids), bentonites with various qualities and properties, generally inorganic rheology additives for various polar solvent mixtures, nitrocellulose, ethylcellulose and other cellulose compounds, polyvinylpyrrolidones with variable quality, starch (+$NH_4OH$), gelatine, alginic acid, synthetic Mg—Na—Li silicate (Laponite), highly disperse amorphous silicic acid (Aerosil), polyvinylbutyral (Mowital) (highly soluble e.g. in butyl glycol), sodium carboxymethylcellulose (vivistar), thermoplastic polyamide resin (Eurelon) (needs to be boiled down at about 180° C.), organic ricinus oil derivative (Thixin R), diamide wax (Thixatrol plus), swelling polyacrylates (Rheolate), polyetherurea-polyurethane (Rheolate), polyether-polyols (Rheolate) or Mg—Al hydrosilicate.

Particularly highly suitable additives are those that bind well with the other components, advantageously can be predried tack-free at temperatures below 200° C. and burn without leaving residues at 200–500° C.

The viscosity of the highly pure dopant paste is adjusted by the thickening agent, as well as by the solvent used.

A basic requirement for a good dopant paste in photovoltaic technology is the lowest possible contamination with metallic compounds. In particular, the cations of the metals iron, chromium, copper, nickel, gold, calcium etc., often referred to in the literature as carrier lifetime "killers", in particular, are undesirable. Their concentrations should be as far as possible below 200 ppb in the paste. In particular cases, the concentrations should as far as possible not exceed 100 ppb. In order to make it possible to comply with these conditions, in particular cases only purified starting materials can be used.

Besides the components mentioned so far, the addition of solvents is necessary for the production of the pastes.

Suitable organic solvents include hydrophilic polyalcohols (ethylene glycol, ethylene glycol monobutyl ether, ethylene glycol monophenyl ether, methoxymethoxyethanol, ethylene glycol monoacetate, ethylene glycol diacetate, diethylene glycol, diethylene glycol monomethyl ether, diethylene glycol monoethyl ether acetate, diethylene glecol monobutyl ether, diethylene glycol monobutyl ether acetate, diethylene glycol dimethyl ether, diethylene glycol methylethyl ether, diethylene glycol diethyl ether, diethylene glycol acetate, triethylglycol, triethylene glycol monomethyl ether, triethylene glycol monoethyl ether, tetraethylene glycol, liq. polyethylene glycols, propylene glycol, propylene glycol monomethyl ether, propylene glycol monoethyl ether, propylene glycol monobutyl ether, 1-butoxyethoxypropanol, dipropylglycol, dipropylene glycol monomethyl ether, dipropylene glycol monoethyl ether, tripropylene glycol monomethyl ether, polypropylene glycols, trimethylene glycol, butanedial, 1,5-pentanedial, hexylene glycol, oxylene glycol, oxylene glycol, glycerine, glyceryl acetate, glyceryl diacetate, glyceryl triacetate, trimethylolpropyne, 1,2,6-haxanetriol) or hydrophilic derivatives thereof.

Hydrophilic ethers (dioxane, trioxane, tetrahydrofuran, tetrahydropyran, methylal), diethylacetal, methyl ethyl ketone, methyl isobutyl ketone, diethyl ketone, acetonylacetone, diacetone alcohol or hydrophilic esters (methyl formate, ethyl formate, propyl formate, methyl acetate, ethyl acetate) may furthermore be used as solvents.

Tests have shown that application of a 50–100 mg quantity of paste to a customarily used wafer is sufficient to achieve a dopant effect. The application of the paste according to the invention to the wafer to be treated can be carried out with the methods known to the person skilled in the art. In particular, application by the screen-printing process is suitable for this purpose. The conversion of the applied paste into the desired dopant layers takes place, in the known fashion, by heating to temperatures of 200 to 600° C., preferably to about 500° C. The required heating time depends on the thickness of the layer of paste applied.

The paste according to the invention is suitable for use in chip production but, in particular, also for use in the production of solar cells used in solar technology.

For example, it has been found that through using boron pastes according to the invention for the production of doped glass layers, the efficiency of solar cells, which is usually 14% in production, is increased by about 1.5 to 2%.

For better understanding and for clarification, examples will be given below which fall within the scope of protection of the present invention but do not restrict the invention to these examples.

EXAMPLE

TEOS (1.43 g) was placed in a beaker. The solvent N-methylpyrrolidone NMP (83 g) was then added and the basic mixture was prepared with the aid of a KPG stirrer. Polyvinylpyrrolidone (11 g), diboron trioxide (4.6 g) and finally lactic acid (3 g) were then added in succession. During the addition, it was furthermore necessary to stir vigorously. After the addition had been completed, the mixture was stirred for about 30 min more. Transfer to containers took place after a short waiting time. This waiting time was necessary for the bubbles formed in the mixture to be able to break-up.

This mixture gave a paste by means of which a boron glass was formed on the wafer, i.e. doping of the monocrystalline and polycrystalline Si wafer was obtained in a controlled way with the desired boron concentration.

The paste obtained is stable in storage, easy to handle and printable. It can be removed from the screen-printing cloth with standard solvents.

What is claimed is:

1. A screen-printable dopant paste for the selective patterning and extensive printing of Si wafers to produce p, p+, p++, n, n+, and n++ regions in the Si wafers, said paste comprising:
    a) one or more components with dopant action,
    b) one or more silanes of the formula $R^1_n Si(OR)_{4-n}$,
       in which
       $R^1$ is methyl, ethyl or phenyl,
       R is methyl, ethyl, n-propyl or iso-propyl, and
       n is 0,1 or 2,
    c) one or more solvents,
    d) a thickening agent or wetting agent,
    e) optionally an acid and water, and
    f) optionally one or more additives,
       the total composition having impurities in the form of metal ions in respective concentrations of less than 200 ppb,
    wherein said dopant paste contains 0.1–5% by weight of said silanes.

2. A dopant paste according to claim 1, said one or more components with dopant action are selected from boron salts, boron oxide, organic boron compounds, boron-aluminum compounds, phosphorus salts, phosphorous pentoxide, phosphoric acid, organophosphorus compounds and organic aluminum compounds.

3. A dopant paste according to claim 1, wherein said one or more components with dopant action are selected from boron oxide, phosphoric acid, phosphorus pentoxide, and aluminium salts.

4. A dopant paste according to claim 1, wherein said one or more components with dopant action are selected from the group organic boron compounds, organic phosphorus compounds and organic aluminium compounds.

5. A dopant paste according to claim 1, wherein said one or more components with dopant action are selected from boron oxide, phosphoric acid, phosphorus pentoxide, and aluminium salts, and one or more components with dopant action from organic boron compounds, organic phosphorus compounds and organic aluminium compounds.

6. A dopant paste according to claim 1, wherein said silanes are selected from tetramethoxysilane, tetraethoxysilane, tetrabutoxysilane, tetrapropoxysilane, and mixtures thereof.

7. A dopant paste according to claim 1, wherein the concentration of impurities in the form of metal ions is less than 100 ppb.

8. A dopant paste according to claim 1, wherein said paste contains said one or more additives which are selected from antifoaming agents, adhesion moderators, additional thickening agents, additional wetting agents, levelling agents and thixotropic agents.

9. A dopant paste according to claim 1, wherein said acid is nitric acid, hydrochloric acid, lactic acid, oxalic acid, or formic acid.

10. A dopant paste according to claim 1, wherein said one or more components with dopant action are selected from boron oxide, phosphoric acid, and phosphorus pentoxide.

11. A dopant paste according to claim 1, wherein said one or more solvents are selected from hydrophilic polyalcohols, hydrophilic ethers and hydrophillic esters.

12. A dopant paste according to claim 1, wherein said one or more solvents are selected from ethylene glycol, ethylene glycol monobutyl ether, ethylene glycol monophenyl ether, methoxymethoxyethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methylethyl ether, diethylene glycol diethyl ether, diethylene glycol acetate, triethylglycol, triethylene glycol monomethyl ether, triethylene glycol monoethyl ether, tetraethylene glycol, liq. polyethylene glycols, propylene glycol, propylene glycol monomethyl ether, propylene glycol monoethyl ether, propylene glycol monobutyl ether, 1-butoxyethoxypropanol, dipropylglycol, dipropylene glycol monomethyl ether, dipropylene glycol monoethyl ether, tripropylene glycol monomethyl ether, polypropylene glycols, trimethylene glycol, butanedial, 1,5-pentanedial, hexylene glycol, glycerine, glyceryl acetate, glyceryl diacetate, glyceryl triacetate, trimethylolpropyne, 1,2,6-haxanetriol, dioxane, trioxane, tetrahydrofuran, tetrahydropyran, methylal, diethylacetal, methyl ethyl ketone, methyl isobutyl ketone, diethyl ketone, acetonylacetone, diacetone alcohol, methyl formate, ethyl formate, propyl formate, methyl acetate and ethyl.

13. A dopant paste according to claim 1, wherein said paste contains an acid.

14. A screen-printable dopant paste for the selective patterning and extensive printing of Si wafers to produce p, p+, p++, n, n+, and n++ regions in the Si wafers, said paste comprising:
   a) one or more components with dopant action,
   b) one or more silanes of the formula $R^1{}_n Si(OR)_{4-n}$,
      in which
         $R^1$ is methyl, ethyl or phenyl,
         R is methyl, ethyl, n-propyl or iso-propyl, and
         n is 0, 1 or 2,
   c) one or more solvents,
   d) a thickening agent or wetting agent,
   e) optionally an acid and water, and
   f) optionally one or more additives,
      the total composition having impurities in the form of metal ions in respective concentrations of less than 200 ppb,
      wherein said one or more components with dopant action is $B_2O_3$ or $P_2O_5$ and,
      said one or more silanes form an $SiO_2$ matrix wherein the ratio of $SiO_2$ to $B_2O_3$ or $P_2O_5$ is 10–80% $B_2O_3$ or $P_2O_5$ in $SiO_2$.

15. A screen-printable dopant paste for the selective patterning and extensive printing of Si wafers to produce p, p+, p++, n, n+, and n++ regions in the Si wafers, said paste comprising:
   a) one or more components with dopant action,
   b) one or more silanes of the formula $R^1{}_n Si(OR)_{4-n}$,
      in which
         $R^1$ is methyl, ethyl or phenyl,
         R is methyl, ethyl, n-propyl or iso-propyl, and
         n is 0, 1 or 2,
   c) one or more solvents,
   d) a thickening agent or wetting agent,
   e) optionally an acid and water, and
   f) optionally one or more additives,
      the total composition having impurities in the form of metal ions in respective concentrations of less than 200 ppb,
      wherein said dopant paste contains 50–80% by weight of said one or more solvents.

16. A process for the preparation of a semiconductor comprising applying a dopant paste according to claim 1 to the surface of an Si wafer by screen-printing.

17. A process according to claim 16, wherein said one or more components with dopant action contains boron or phosphorus, and said process further comprises:
   converting the applied paste into a dopant layer of boro- or phosphorus silicate glass by heating to a temperatures of 200 to 600° C., whereby said glass forms a source of dopant and
   penetrating dopant from said source of dopant into the wafer by controlled diffusion in an air or oxygen atmosphere at a temperature of 900–950° C., when said one or more components with dopant action contains phosphorus, or at a temperature of 950–1050° C., when said one or more components with dopant action contains boron.

18. A screen-printable masking paste comprising:
   a) one or more silanes of the formula $R^1{}_n Si(OR)_{4-n}$,
      in which
         $R^1$ is methyl, ethyl or phenyl,
         R is methyl, ethyl, n-propyl or iso-propyl, and
         n is 0, 1 or 2,
   b) one or more solvents,
   c) a thickening agent or wetting agent,
   d) optionally an acid and water, and
   e) optionally one or more additives,
      the total composition having impurities in the form of metal ions in respective concentrations of less than 200 ppb,
      wherein said masking paste contains 0.1–5% by weight of said silanes.

19. A making paste according to claim 18, wherein the concentration of impurities in the form of metal ions is less than 100 ppb.

20. A masking paste according to claim 18, wherein said masking paste contains 50–80% by weight of said one or more solvents.

21. A masking paste according to claim 18, wherein said masking paste contains an acid.

22. A process for applying a masking paste to a semiconductor comprising applying a masking paste according to claim 18 to the surface of an Si wafer by screen-printing.

* * * * *